(12) United States Patent
Kanno (10) Patent No.: US 10,474,028 B2
(45) Date of Patent: Nov. 12, 2019

(54) TEMPLATE, METHOD FOR FABRICATING TEMPLATE, AND METHOD FOR MANUFACTURING SEMICONDUCTOR DEVICE

(71) Applicant: TOSHIBA MEMORY CORPORATION, Minato-ku, Tokyo (JP)

(72) Inventor: Masahiro Kanno, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/909,120

(22) Filed: Mar. 1, 2018

(65) Prior Publication Data

US 2019/0079392 A1    Mar. 14, 2019

(30) Foreign Application Priority Data

Sep. 12, 2017 (JP) .................. 2017-175030

(51) Int. Cl.
  *G03F 7/00* (2006.01)
  *H01L 21/027* (2006.01)
  *B29C 59/02* (2006.01)
(52) U.S. Cl.
  CPC .......... *G03F 7/0002* (2013.01); *B29C 59/022* (2013.01); *H01L 21/0272* (2013.01)
(58) Field of Classification Search
  None
  See application file for complete search history.

(56) References Cited

U.S. PATENT DOCUMENTS

| 2006/0266244 A1* | 11/2006 | Kruijt-Stegeman | B41F 1/18 101/485 |
| 2011/0062623 A1* | 3/2011 | Saito | B82Y 10/00 264/219 |
| 2012/0318561 A1* | 12/2012 | Takahata | G03F 7/0002 174/250 |

(Continued)

FOREIGN PATENT DOCUMENTS

| JP | 2010251601 A | * 11/2010 |
| JP | 2012-190827 A | 10/2012 |

(Continued)

*Primary Examiner* — Angel Roman
(74) *Attorney, Agent, or Firm* — Foley & Lardner LLP (57) ABSTRACT

A method for fabricating a template includes providing a substrate having a first protrusion portion, forming, on the first protrusion portion of the substrate, a first film including a plurality of first pattern portions and a second pattern portion surrounding the first pattern portions and having a thickness thicker than the first pattern portions, covering at least a portion of the first film with a second film, removing the second pattern portion and exposing one or more of the first pattern portions by removing a portion of the second film from an upper surface of the first pattern by a first etching process, and forming a second protrusion portion by etching the first protrusion portion using the second film as a mask. The method further includes removing the first pattern portions and processing the first protrusion portion and the second protrusion portion by a second etching process.

13 Claims, 5 Drawing Sheets

(56) References Cited

U.S. PATENT DOCUMENTS

| | | | |
|---|---|---|---|
| 2015/0221501 A1* | 8/2015 | Tsuji | G03F 7/0002 264/447 |
| 2016/0118249 A1* | 4/2016 | Sreenivasan | H01L 21/02381 438/699 |
| 2016/0308020 A1* | 10/2016 | Sreenivasan | H01L 29/6659 |
| 2018/0074419 A1* | 3/2018 | Jung | G03F 9/7042 |
| 2018/0210352 A1* | 7/2018 | Jung | G03F 7/0002 |

FOREIGN PATENT DOCUMENTS

| | | | |
|---|---|---|---|
| JP | 5983218 B2 | | 8/2016 |
| JP | 6205825 B2 | | 10/2017 |
| JP | 2018014483 A | * | 1/2018 |

* cited by examiner

TEMPLATE, METHOD FOR FABRICATING TEMPLATE, AND METHOD FOR MANUFACTURING SEMICONDUCTOR DEVICE

CROSS-REFERENCE TO RELATED APPLICATION

This application claims the benefit of and priority to Japanese Patent Application No. 2017-175030, filed Sep. 12, 2017, the entire contents of which are incorporated herein by reference.

FIELD

Embodiments described herein relate generally to a template, a method for fabricating the template, and a method for manufacturing a semiconductor device.

BACKGROUND

A template for nanoimprinting can have an uneven pattern (e.g. a non-uniform pattern) on a protrusion portion called a mesa. In this case, when a pattern is formed on a substrate using a one-step mesa type template, coating liquid can leak out from a gap between the substrate and the template, which can be problematic. In some implementations a two-step mesa type template configured to prevent leaking out of the coating liquid can be used. However, such an implementation may involve carrying out an imprint process twice when the two-step mesa type template is fabricated and thus, a fabrication cost of the template can be high, which may be problematic.

DETAILED DESCRIPTION

Example embodiments provides for a template that can readily implement or utilize a structure having a two-step protrusion portion, a method for fabricating the template, and a method for manufacturing a semiconductor device.

In general, according to an aspect of the present disclosure, one or more embodiments of a method for fabricating a template includes providing a substrate having a first protrusion portion, and forming, on the first protrusion portion of the substrate, a first film that includes a plurality of first pattern portions having a first film thickness and a second pattern portion surrounding the first pattern portions and having a second film thickness thicker than the first film thickness. The method further includes removing the second pattern portion. The method further includes exposing the first pattern portions by removing the second film from an upper surface of one or more of the first pattern portions by a first etching process, and forming a second protrusion portion in the substrate by etching the first protrusion portion of the substrate using the second film as a mask. The method further includes removing the first pattern portions. The method further includes processing the first protrusion portion and the second protrusion portion by a second etching process using the second film as a mask.

Hereinafter the exemplary embodiment of the present disclosure will be described with reference to the drawings.

First Aspect

Figure 1A:
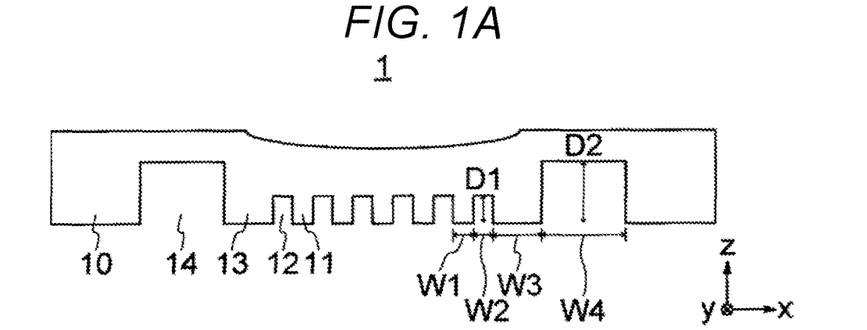
FIGS. 1A and 1B are cross-sectional views illustrating one or more embodiments of a template.
Figure 1B:
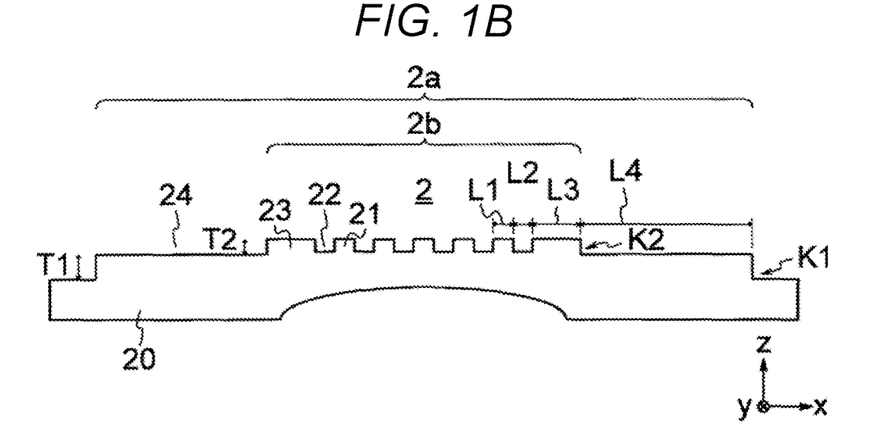

FIGS. 1A and 1B are cross-sectional views illustrating one or more embodiments of a structure of a template according to a first aspect.

FIG. 1A illustrates a first template 1 (e.g. an original template). FIG. 1B illustrates a second template 2 (e.g. a replica template) fabricated using the original template 1. The replica template 2 is a two-step mesa type template including a first mesa 2a, which is an example of a first protrusion portion, and a second mesa 2b, which is an example of a second protrusion portion.

The original template 1 includes a plurality of first protrusion portions 11, a plurality of first recess portions 12, a second protrusion portion 13, and a second recess portion 14 that are provided on (or in), or are defined by, the substrate 10.

In one or more embodiments the substrate 10 is a quartz substrate. In FIG. 1A, an X-direction and a Y-direction which are parallel to a front surface of the substrate 10 and perpendicular to each other, and a Z-direction perpendicular to the front surface of the substrate 10 are illustrated. In the present specification, the +Z-direction is referred to as an upward direction and the −Z-direction is referred to as a downward direction. The −Z-direction may coincide with the direction of gravity or may not coincide with the direction of gravity.

As illustrated in FIG. 1A, the plurality of first protrusion portions 11 and the plurality of first recess portions 12 are alternately provided on (or in) an under surface of the substrate 10. The first protrusion portions 11 and the first recess portions 12 extend in the Y-direction and are adjacent to each other in the X-direction.

The second protrusion portion 13 is provided on the under surface of the substrate 10 and a cross section of the second protrusion portion 13 has a polygon shape, such as a quadrangular shape. The second protrusion portion 13 surrounds the first protrusion portions 11 and the first recess portions 12. In one or more embodiments, the second protrusion portion 13 is annular. The second recess portion 14 is provided in the under surface of the substrate 10, and a cross section of the second recess portion 14 has a polygon shape (e.g. a quadrangular shape). The second recess portion 14 surrounds the first protrusion portions 11, the first recess portions 12, and the second protrusion portion 13. In one or more embodiments, the second recess portion 14 is annular.

In FIG. 1A, a width W1 of the first protrusion portion 11, a width W2 and a depth D1 of the first recess portion 12, a width W3 of the second protrusion portion 13, a width W4 and a depth D2 of the second recess portion 14 are illustrated. In one or more embodiments, the depth D2 of the second recess portion 14 is set to be deeper than the depth D1 of the first recess portion 12, and the depth D2 is set to be about two times or less the depth D1 of the first recess portion 12. The following relationship may apply: D1<D2≤about 2×D1. Furthermore, the width W3 of the second protrusion portion 13 is set to be greater than the width W1 of the first protrusion portion 11 (e.g. a ratio of the width W3 to the width W1 is about 1.1 or more, about 1.2 or more, or about 1.3 or more), and the width W4 of the second recess portion 14 is set to be greater than the width W2 of the first recess portions 12 (e.g. a ratio of the width W3 to the width W1 is about 1.1 or more, about 1.2 or more, or about 1.3 or more). The following relationship may apply: W3>W1, W4>W2. The width W1 and the width W2 are set to about equal to a same value.

The replica template 2, as shown in FIG. 1B, includes a plurality of first protrusion portions 21, a plurality of recess portions 22, a second protrusion portion 23, and a second recess portion 24 that are provided on (or in), or are defined by, a substrate 20.

In one or more embodiments the substrate 20 is a quartz substrate. The first mesa 2a is provided on the upper surface of the substrate 20 and has a thickness T1. The first mesa 2a may be a raised or stepped-up portion of the substrate 20 that is higher than another portion of the substrate 20. The second mesa 2b is provided on the central portion of the first mesa 2a on the upper surface of the substrate 20 and has a thickness T2, as measured from the first mesa 2a to a top surface of the second mesa 2b. The second mesa 2b may be a raised or stepped-up portion of the substrate 20 that is higher than the mesa 2a. In one or more embodiments, the thickness T2 of the second mesa 2b is set to be less than the thickness T1 of the first mesa 2a (T2<T1). A ratio of the thickness T2 to the thickness T1 may be in a range of about 30 to about 300. The thickness T1 of the first mesa 2a is, for example, about 30 micrometers (μm). The thickness T2 of the second mesa 2b is, for example, in a range of about 0.1 μm to about 1 μm.

As illustrated in FIG. 1B, the plurality of first protrusion portions 21 and the plurality of recess portions 22 are alternately provided on (or in) the upper surface of the substrate 20. The first protrusion portions 21 and the recess portions 22 extend in the Y-direction and are adjacent to each other in the X-direction. The first protrusion portions 21 and the recess portions 22 are provided on (or in) the upper surface of the second mesa 2b.

The second protrusion portion 23 is provided on the upper surface of the substrate 20 and a cross section of the second protrusion portion 23 has a polygon shape, such as a quadrangular shape. The second protrusion portion 23 surrounds the first protrusion portions 21 and the recess portions 22. In one or more embodiments, the second protrusion portion 23 is annular. The second recess portion 24 is provided in the upper surface of the substrate 20 and a cross section of the second recess portion 24 has a polygon shape, such as a quadrangular shape. The second recess portion 24 surrounds the first protrusion portions 21, the recess portions 22, and the second protrusion portion 23. In one or more embodiments, the second recess portion 24 is annular. The second protrusion portion 23 is provided on, or may define at least a portion of, the upper surface of the second mesa 2b, and the second recess portion 24 is provided in, or may define at least a portion of, the upper surface of the first mesa 2a so as to surround the second mesa 2b.

In FIG. 1B, a side surface K1 of an outer periphery of the first mesa 2a and a side surface K2 of an outer periphery of the second mesa 2b are illustrated. The first mesa 2a can be formed by wet etching the substrate 20 and thus, the side surface K1 may be inclined (e.g. slightly inclined). On the other hand, the second mesa 2b may be formed by dry etching the substrate 20 and thus, the side surface K2 may be steeply inclined. In one or more embodiments, the side surface K2 is more steeply inclined than is the side surface K1 (e.g. an angle of inclination of the side surface K2 may be about 1 degree or more, about 5 degrees or more, or about 10 degrees or more than an angle of inclination of the side surface K2).

In some comparative implementations in which the replica template 2 is not provided with the second mesa 2b, when a pattern is formed on a substrate using the replica template 2, coating liquid oozes or leaks out from a gap between the substrate and the replica template 2, which can be problematic. Because the side surface K1 is gently inclined, the coating liquid can readily ooze out along the side surface K1.

On the other hand, when the replica template 2 is provided with the second mesa 2b, as in one or more of the embodiments described herein, the side surface K2 is interposed between the coating liquid and the side surface K1 and thus, the coating liquid is less likely to ooze out along the side surface K1. Thus, according to as in one or more of the embodiments described herein, it is possible to prevent or reduce the likelihood of undesirable oozing of the coating liquid.

FIGS. 2A to 2C and FIGS. 3A to 3D are cross-sectional views illustrating one or more embodiments of a method for fabricating the template according to the first aspect, and illustrate a process for fabricating the replica template 2 using the original template 1.

Figure 2A:
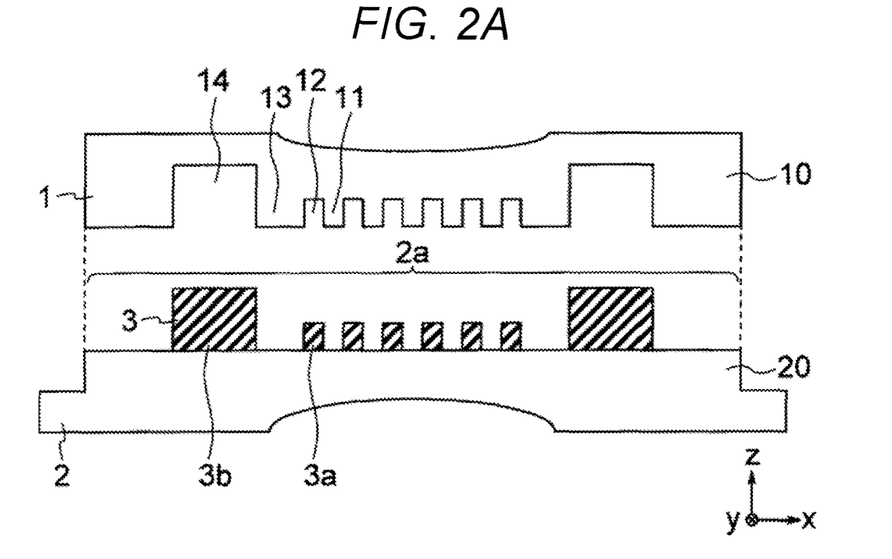
FIGS. 2A to 2C are cross-sectional views illustrating one or more embodiments of a method for fabricating the template.

As shown in FIG. 2A, the substrate 20 defining the first mesa 2a is provided, a resist film 3 for nanoimprinting is formed on the first mesa 2a, and a pattern of the original template 1 (e.g. an uneven pattern) is transferred to the resist film 3 by nanoimprinting using the original template 1. As a result, a first pattern including a plurality of first resist pattern portions 3a corresponding to the first recess portions 12 of the original template 1, and a second pattern including a second resist pattern portion 3b corresponding to the second recess portion 14 of the original template 1 are formed on the resist film 3.

Accordingly, the first resist pattern portions 3a have a substantially same width as the width W2 and a substantially same film thickness as the depth D1. The second resist pattern portion 3b has a substantially same width as the width W4 and a substantially same film thickness as the depth D2. As a result, the film thickness of the second resist pattern portion 3b is thicker than the film thickness of the first resist pattern portions 3a. The relationship of "D1<D2 about 2×D1" described above may also apply for the film thicknesses of the first and second resist pattern portions; that is, the film thickness of the second resist pattern portion 3b is greater than the film thickness of the first resist pattern portions 3a, but no more than two times greater than the film thickness of the first resist pattern portions 3a. Furthermore, a distance between adjacent ones of the first resist pattern portions 3a is substantially a same value as the width W1, and a distance between the second resist pattern portion 3b and an adjacent one of the first resist pattern portions 3a is substantially a same value as the width W3.

Configurations described above are also similarly applied to the shapes and layouts of the first and second resist pattern portions 3a and 3b. The first resist pattern portions 3a extend in the Y-direction and are adjacent to each other in the X-direction. The second resist pattern portion 3b has a polygon shape, such as a quadrangular shape. The second resist pattern portion 3b surrounds the first resist pattern portions 3a. In one or more embodiments, second resist pattern portion 3b is annular. The resist film 3 is an example of a first film. As described above, the first mesa 2a can be formed by wet etching the substrate 20.

Figure 2B:
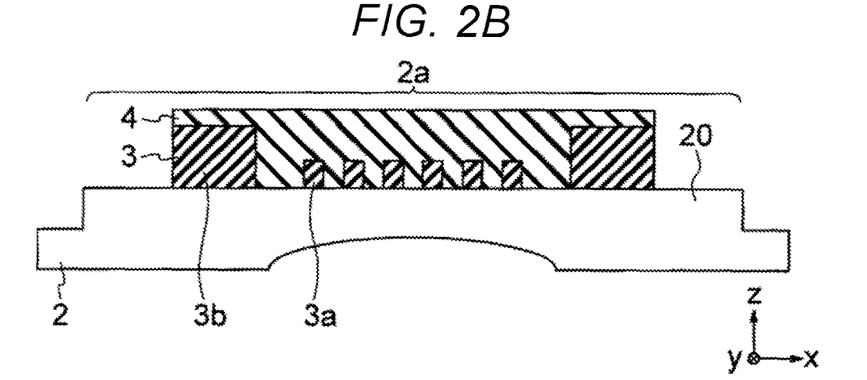

As shown in FIG. 2B, a reversal agent layer 4 for reversing a resist pattern is formed on the first and second resist pattern portions 3a and 3b. The reversal agent layer 4 is an example of a second film. The reversal agent layer 4 is formed, for example, by applying liquid containing a reversal agent onto the first and second resist pattern portions 3a and 3b. The reversal agent layer 4 is formed so as to substantially cover the upper surfaces of the first and second resist pattern portions 3a and 3b.

Figure 2C:
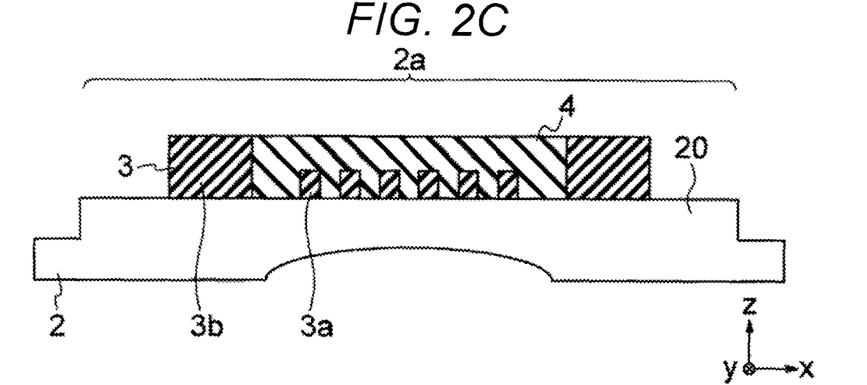

As shown in FIG. 2C, the reversal agent layer 4 is etched back by dry etching to remove the reversal agent layer 4 from the upper surface of the second resist pattern portion 3b. As a result, the upper surface of the second resist pattern portion 3b is exposed from the reversal agent layer 4. The upper surfaces and the side surfaces of the first resist pattern portions 3a remain covered by the reversal agent layer 4.

The reversal agent layer 4 may be formed by providing, dropping or discharging liquid containing a reversing agent (reversing agent liquid) to a region (surrounded region) surrounded by the second resist pattern portion 3b. In this case, the reversal agent layer 4 is not formed on the upper surface of the second resist pattern portion 3b and thus, the process of FIG. 2C can be omitted.

For example, a rod-shaped pipe that drops a reversing agent liquid from one or more holes is provided and the reversing agent liquid is dropped from the pipe while the surrounded region is scanned with the pipe, so that the reversing agent liquid may be dropped selectively on the surrounding region. A nozzle that discharges the reversing agent liquid is provided and the reversing agent liquid is discharged from the nozzle to the surrounding region, so that the reversing agent liquid may be discharged selectively to the surrounded region.

Figure 3A:
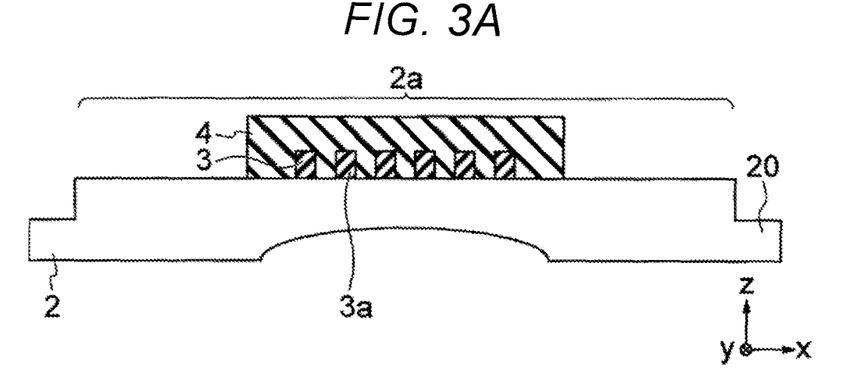
FIGS. 3A to 3D are cross-sectional views illustrating one or more embodiments of the method for fabricating the template.

As shown in FIG. 3A, the second resist pattern portion 3b is removed. In this case, the first resist pattern portions 3a are covered with the reversal agent layer 4 and thus, the first resist pattern portions 3a are not removed.

Figure 3B:
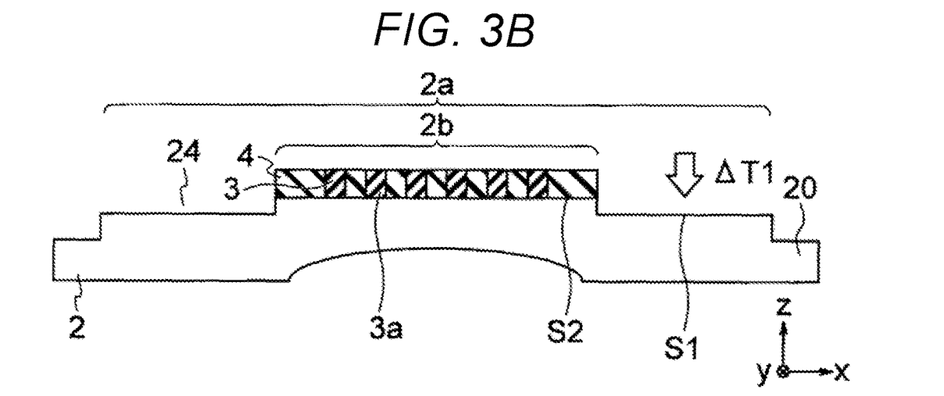

As shown in FIG. 3B, the reversal agent layer 4 is etched back by dry etching to remove the reversal agent layer 4 from the upper surface of the first resist pattern 3a. As a result, the upper surface of the first resist pattern portions 3a is exposed from the reversal agent layer 4. The etch-back described above is an example of a first etching process.

In the etch-back, the first mesa 2a of the substrate 20 is also etched by using the reversal agent layer 4 as a mask. The first mesa 2a has a first upper surface S1 that is not covered with the reversal agent layer 4 and a second upper surface S2 that is covered with the reversal agent layer 4, and the first upper surface S1 is selectively lowered by etching. As a result, the second mesa 2b having the second upper surface S2 surrounded by the first upper surface S1 is formed on the first mesa 2a. The second recess portion 24 illustrated in FIG. 1B is formed thus in the first mesa 2a. The symbol ΔT1 in FIG. 3C indicates an etching amount of the first upper surface S1, that is, a height from the first upper surface S1 to the second upper surface S2.

Figure 3C:
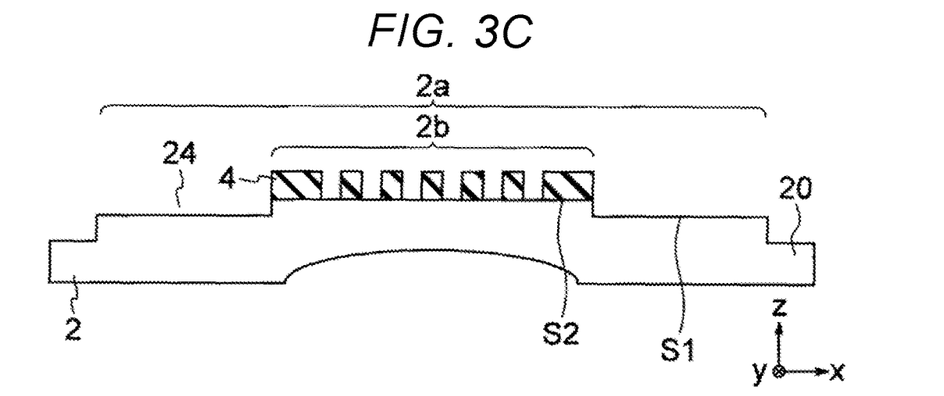

As shown in FIG. 3C, the first resist pattern portions 3a are removed. As a result, a pattern (e.g. an uneven pattern) of the reversal agent layer 4 is formed on the second mesa 2b.

Figure 3D:
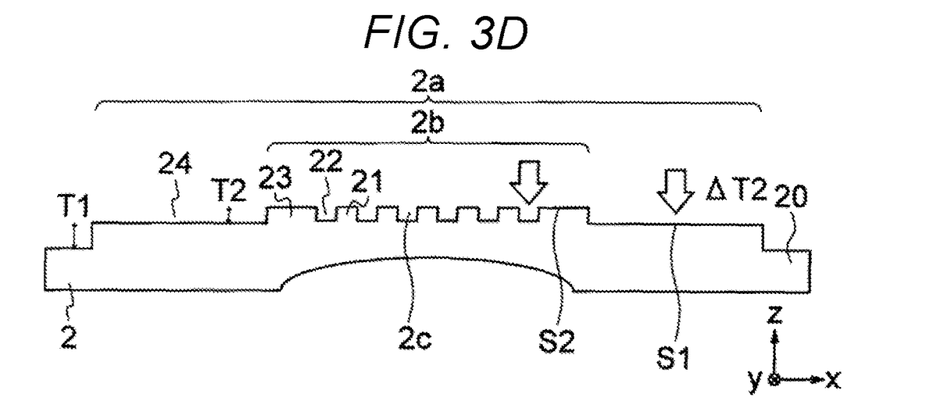

As shown in FIG. 3D, the first and second mesas 2a and 2b of the substrate 20 are etched back by dry etching in which the reversal agent layer 4 is used as a mask. In this case, the reversal agent layer 4 is removed. The etch-back described above is an example of a second etching process.

In the etch-back, the first upper surface S1 is lowered with respect to the second upper surface S2 by etching. The symbol ΔT2 indicates the etching amount of the first upper surface S1. The sum of the etching amounts ΔT1 and ΔT2 is the thickness T2 of the second mesa 2b. In one or more embodiments, the etching amounts ΔT1 and ΔT2 is adjusted so that the thickness T2 of the second mesa 2b becomes a desired value.

Furthermore, in the etch-back, the pattern (e.g. the uneven pattern) of the reversal agent layer 4 is transferred to the second mesa 2b (second upper surface S2) by etching. As a result, the first protrusion portions 21, the recess portion 22, and the second protrusion portion 23 illustrated in FIG. 1B are formed in the second mesa 2b.

In this way, the replica template 2 is fabricated. In the first embodiment, both the first mesa 2a and the second mesa 2b are also processed by using the pattern (e.g. the uneven pattern) of the original template 1. Thus, according to one or more embodiments, it becomes possible to readily fabricate the two-step mesa type replica template 2 by the imprinting process illustrated in FIG. 2A. With this, it becomes possible to reduce the fabrication cost of the replica template 2. Furthermore, the film thickness of the reversal agent layer 4 can be made uniform and thus, it is possible to improve processing accuracy of a circuit pattern manufactured from the replica template 2.

When the depth D2 of the second recess portion 14 of the original template 1 is deep, the thickness of the reversal agent layer 4 on the first resist pattern portions 3a become thicker (see FIG. 3A). In this case, the burden of the etch back illustrated in FIG. 3B is increased. In one or more embodiments, the depth D2 is set to be two times or less as deep as the depth D1. This reduces the burden of the etch-back illustrated in FIG. 3B.

Etching of the substrate 20 progresses not only by the etch-back illustrated in FIG. 3B and the etch-back illustrated in FIG. 3D, but also by the etch-back illustrated in FIG. 2C. For that reason, in a case where influence by the etch-back illustrated in FIG. 2C is large, the thickness T2 of the second mesa 2b may be adjusted to a desired value by taking the etching amount of the three etch-back processes into account.

Figure 4A:
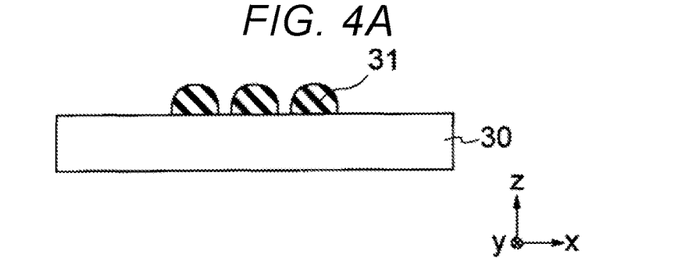
FIGS. 4A to 4C are cross-sectional views illustrating one or more embodiments of a method for manufacturing a semiconductor device.
Figure 4B:
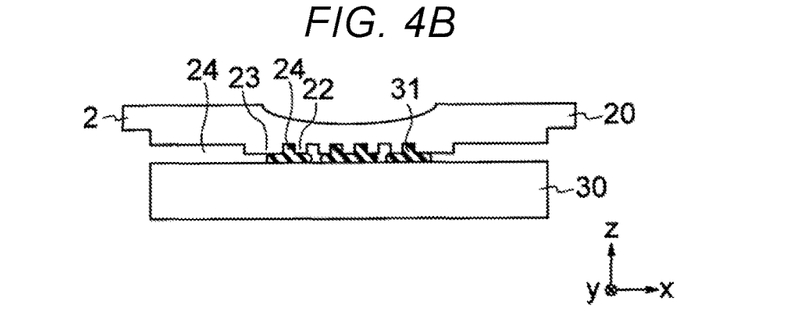
Figure 4C:
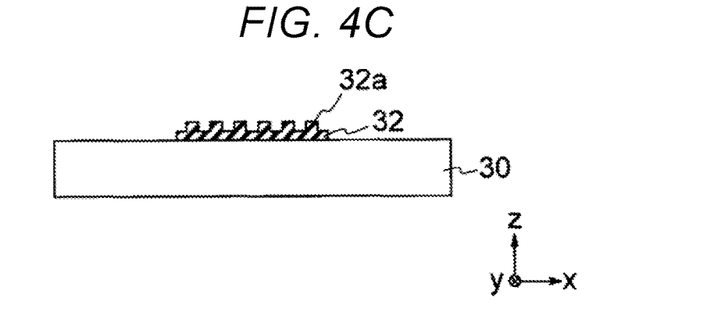

FIG. 4A through FIG. 4C are cross-sectional views illustrating one or more embodiments of a method for manufacturing a semiconductor device according to the first aspect.

As shown in FIG. 4A, a resist material 31 is coated onto or dropped on a substrate 30. The substrate 30 is, for example, a substrate to be processed (wafer to be processed) including a semiconductor substrate (semiconductor wafer) and a film to be processed on the semiconductor substrate. In a case where the semiconductor substrate itself is processed, the substrate 30 may omit the film to be processed. The substrate 30 is an example of a wafer and a resist material 31 is an example of a resin.

As shown in FIG. 4B, a pattern forming surface of the replica template 2 described above is imprinted on the resist material 31, and the resist material 31 is cured. With this, the pattern (e.g. the uneven pattern) of the replica template 2 is transferred to the resist material 31.

As shown in FIG. 4C, the replica template 2 is released from the resist material 31. With this, a resist film 32 composed of the cured resist material 31 and including resist pattern portions 32a is formed on the substrate 30. By doing as described above, processing using the replica template 2 is performed.

FIG. 5A through FIG. 5D are cross-sectional views illustrating a method for fabricating a comparative template, and illustrates a process for fabricating the replica template 2 using two templates (e.g. two original templates) $1_1$ and $1_2$.

Figure 5A:
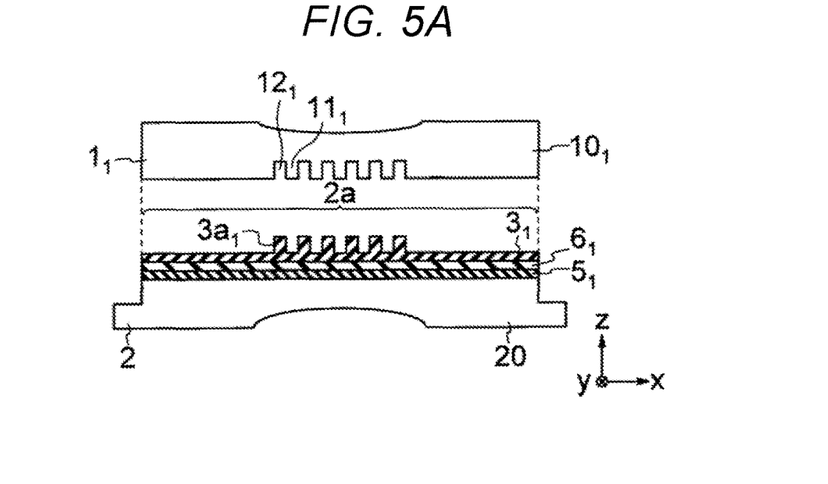
FIGS. 5A to 5D are cross-sectional views illustrating a comparative method for fabricating a template.

In FIG. 5A, a template $1_1$ (e.g. an original template) including a plurality of protrusion portions $11_1$ and defining a plurality of recess portions $12_1$ alternately arranged on a substrate $10_1$ is provided. Furthermore, the substrate 20 having the first mesa 2a is provided, and a first under layer $5_1$, a second under layer $6_1$, and a resist film $3_1$ are formed on the first mesa 2a. An example of the first under layer $5_1$ is a chromium nitride layer and an example of the second under layer $6_1$ is an adhesion film.

As shown in FIG. 5A, the pattern (e.g. the uneven pattern) of the original template $1_1$ is transferred to the resist film $3_1$ by nanoimprinting using the original template $1_1$. As a result, a plurality of resist pattern portions $3a_1$ corresponding to the recess portions $12_1$ of the original template $1_1$ are formed in the resist film $3_1$.

Figure 5B:
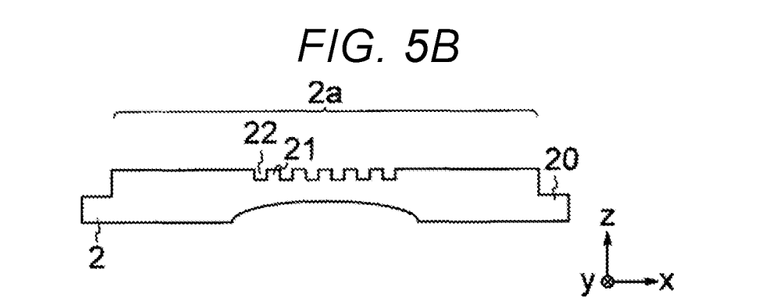

As shown in FIG. 5B, the plurality of resist pattern portions $3a_1$ are transferred to the first mesa 2a and the first protrusion portions 21 and the recess portions 22 are formed.

Figure 5C:
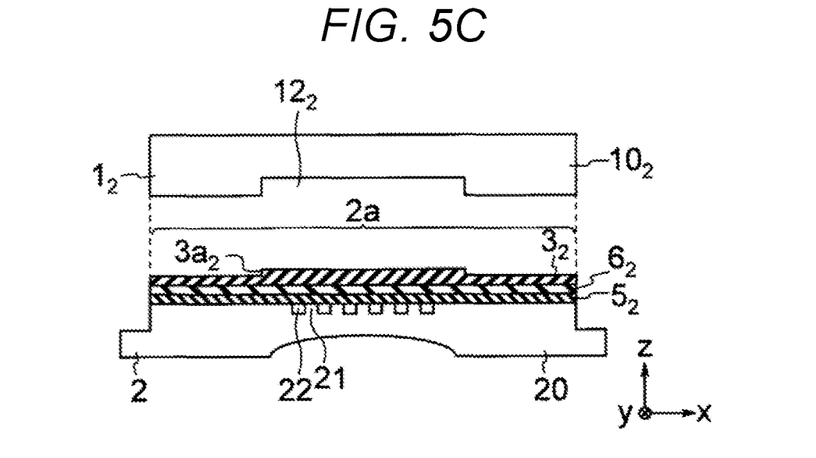

As shown in FIG. 5C, the original template $1_2$ having a recess portion $12_2$ in the substrate $10_2$ is provided. Furthermore, a first under layer $5_2$, a second under layer $6_2$, and a resist film $3_2$ are formed on the first mesa 2a of the substrate 20. An example of the first under layer $5_2$ is a chromium nitride layer and an example of the second under layer $6_2$ is an adhesion film.

The pattern (e.g. the uneven pattern) of the original template $1_2$ is transferred to the resist film $3_2$ by nanoimprinting using the original template $1_2$. As a result, a resist pattern portion $3a_2$ corresponding to a recess portion $12_2$ of the original template $1_1$ is formed on the resist film $3_2$.

Figure 5D:
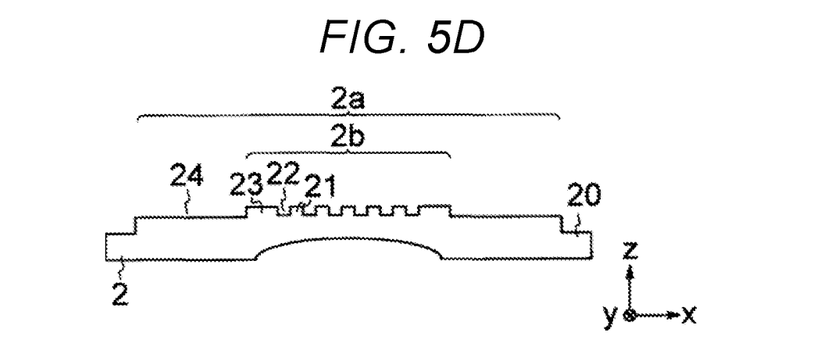

As shown in FIG. 5D, the resist pattern portion $3a_2$ is transferred to the first mesa 2a and the second protrusion portion 23 and the second recess portion 24 are formed. As a result, the second mesa 2b is formed on the first mesa 2a.

By the processes described above, the replica template 2 is fabricated. In the presently described comparative example, the first and second mesas 2a and 2b are processed using the patterns (e.g. the uneven pattern) of the original templates $1_1$ and $1_2$. Thus, in the comparative example, the two-step mesa type replica template 2 is fabricated by two imprinting processes illustrated in FIGS. 5A and 5C, and the fabrication cost of the replica template 2 may be large. By way of comparison, according to the first aspect, a fabrication cost can be kept low by implementing less imprinting processes (e.g. by implementing a single imprinting process).

As described herein, according to the first aspect, both the first mesa 2a and the second mesa 2b are processed using the pattern (e.g. the uneven pattern) of the original template 1 (e.g. using a single template). Thus, according to the first embodiment, it becomes possible to readily implement a structure including the two-step mesa.

As used herein, the singular terms "a," "an," and "the" may include plural referents unless the context clearly dictates otherwise. In the description of some embodiments, a component provided "on," "above," or "over" another component can encompass cases where the former component is directly on (e.g., in physical contact with) the latter component, as well as cases where one or more intervening components are located between the former component and the latter component.

As used herein, the terms "about" and "substantially" are used to describe and account for small variations. When used in conjunction with an event or circumstance, the terms "about" and "substantially" can refer to instances in which the event or circumstance occurs precisely as well as instances in which the event or circumstance occurs to a close approximation. For example, when used in conjunction with a numerical value, the terms "about" and "substantially" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

While certain embodiments have been described, these embodiments have been presented byway of example only, and are not intended to limit the scope of the present disclosure. Indeed, the templates described herein may be embodied in a variety of other forms; furthermore, various omissions, substitutions and changes in the form of the templates described herein may be made without departing from the spirit of the present disclosure. The accompanying claims and their equivalents are intended to cover such forms or modifications as would fall within the scope and spirit of the present disclosure.

What is claimed is:

1. A method for fabricating a template comprising:
   providing a substrate having a first protrusion portion;
   forming, on the first protrusion portion of the substrate, a first film that includes a plurality of first pattern portions having a first film thickness and a second pattern portion surrounding the first pattern portions and having a second film thickness thicker than the first film thickness;
   covering at least a portion of the first film with a second film;
   removing the second pattern portion;
   exposing the first pattern portions by removing a portion of the second film from an upper surface of one or more of the first pattern portions by a first etching process, and forming a second protrusion portion in the substrate by etching the first protrusion portion of the substrate using the second film as a mask;
   removing the first pattern portions; and
   processing the first protrusion portion and the second protrusion portion by a second etching process using the second film as a mask.

2. The method for fabricating a template according to claim 1, further comprising forming the second film to cover the one or more of the first pattern portions.

3. The method for fabricating a template according to claim 2,
   wherein in forming the second film, the second film is formed so as to cover the first pattern portions and the second pattern portion, and further comprising removing at least a portion of the second film until the second pattern portion is exposed.

4. The method for fabricating a template according to claim 2,
   wherein the second film is formed by providing a liquid for forming the second film to a region surrounded by the second pattern portion.

5. The method for fabricating a template according to claim 4,
wherein the first pattern portions and the second pattern portion are formed on the first protrusion portion by using a template provided with a plurality of first recess portions corresponding to the first pattern portions and a second recess portion corresponding to the second pattern portion.

6. The method for fabricating a template according to claim 5,
wherein in the first etching process, a first upper surface of the first protrusion portion is lowered to form the second protrusion portion having a second upper surface surrounded by the first upper surface of the first protrusion portion, and
in the second etching process, the first upper surface is lowered and a plurality of recess portions are formed on the second upper surface.

7. The method for fabricating a template according to claim 2,
wherein in the first etching process, a first upper surface of the first protrusion portion is lowered to form the second protrusion portion having a second upper surface surrounded by the first upper surface of the first protrusion portion, and
in the second etching process, the first upper surface is lowered and a plurality of recess portions are formed on the second upper surface.

8. The method for fabricating a template according to claim 1,
wherein in the first etching process, a first upper surface of the first protrusion portion is lowered to form second protrusion portion having a second upper surface surrounded by the first upper surface of the first protrusion portion, and
in the second etching process, the first upper surface is lowered and a plurality of recess portions are formed on the second upper surface.

9. The method for fabricating a template according to claim 1,
wherein the first pattern portions and the second pattern portion are formed on the first protrusion portion by using a template provided with a plurality of first recess portions corresponding to the first pattern portions and a second recess portion corresponding to the second pattern portion.

10. A template comprising:
a plurality of first protrusion portions provided alternately with a plurality of first recess portions having a first depth;
a second recess portion surrounding the first recess portions and having a second depth deeper than the first depth;
a second protrusion portion provided between the first recess portions and the second recess portion; and
a third protrusion portion surrounding the second recess portion, the second recess portion being provided between the second protrusion portion and the third protrusion portion.

11. The template of claim 10, wherein the second depth is greater than the first depth.

12. The template of claim 11, wherein the second depth is no more than twice as deep as the first depth.

13. A method for manufacturing a semiconductor device comprising:
applying or dropping a resin onto a wafer;
preparing a template fabricated by:
providing a substrate having a first protrusion portion;
forming, on the first protrusion portion of the substrate, a first film that includes a plurality of first pattern portions having a first film thickness and a second pattern portion surrounding the first pattern portions and having a second film thickness thicker than the first film thickness;
covering at least a portion of the first film with a second film;
removing the second pattern portion;
exposing the first pattern portions by removing a portion of the second film from an upper surface of one or more of the first pattern portions by a first etching process, and forming a second protrusion portion in the substrate by etching the first protrusion portion of the substrate using the second film as a mask;
removing the first pattern portions; and
processing the first protrusion portion and the second protrusion portion by a second etching process using the second film as a mask;
imprinting a pattern forming surface of the second protrusion portion of the template with the resin and curing the resin; and
releasing the template from the cured resin.

* * * * *